(12) United States Patent
Kim

(10) Patent No.: US 10,607,713 B2
(45) Date of Patent: Mar. 31, 2020

(54) MEMORY DEVICE AND OPERATION METHOD OF THE SAME

(71) Applicant: SK hynix Inc., Gyeonggi-do (KR)

(72) Inventor: Sung-Ho Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 16/056,897

(22) Filed: Aug. 7, 2018

(65) Prior Publication Data

US 2019/0196904 A1    Jun. 27, 2019

(30) Foreign Application Priority Data

Dec. 21, 2017   (KR) .................. 10-2017-0176875

(51) Int. Cl.
| | |
|---|---|
| *G11C 29/44* | (2006.01) |
| *G06F 11/10* | (2006.01) |
| *H03M 13/29* | (2006.01) |
| *G11C 29/52* | (2006.01) |
| *G11C 29/00* | (2006.01) |
| *G11C 29/42* | (2006.01) |
| *G11C 29/04* | (2006.01) |

(52) U.S. Cl.
CPC .......... *G11C 29/44* (2013.01); *G06F 11/1048* (2013.01); *G06F 11/1068* (2013.01); *G11C 29/42* (2013.01); *G11C 29/52* (2013.01); *G11C 29/76* (2013.01); *H03M 13/2906* (2013.01); *G11C 2029/0411* (2013.01)

(58) Field of Classification Search
CPC ......... G11C 29/04; G11C 29/44; G11C 29/42; G11C 29/52; G11C 29/76; G11C 29/78; G06F 11/22; G06F 11/1048; G06F 11/1068; G06F 11/1072
See application file for complete search history.

(56) References Cited

U.S. PATENT DOCUMENTS

| | | | | |
|---|---|---|---|---|
| 2014/0380117 A1* | 12/2014 | Hirano | ................... | G11C 29/78 714/758 |
| 2015/0098287 A1* | 4/2015 | Lee | ...................... | G11C 29/785 365/200 |

FOREIGN PATENT DOCUMENTS

| | | |
|---|---|---|
| KR | 1020150072576 | 6/2015 |
| KR | 1020170054182 | 5/2017 |

\* cited by examiner

*Primary Examiner* — Shelly A Chase
(74) *Attorney, Agent, or Firm* — IP & T Group LLP

(57) ABSTRACT

A memory device includes: a non-volatile memory circuit suitable for storing defective column information; a defective latch circuit suitable for receiving and storing the defective column information from the non-volatile memory circuit during a boot-up operation; an error correction code generation circuit suitable for generating an error correction code for correcting an error of the defective column information based on the defective column information; an error correction code latch circuit suitable for storing the error correction code; an error correction circuit suitable for correcting an error of the defective column information transferred from the defective latch circuit based on the error correction code which is transferred from the error correction code latch circuit so as to produce an error-corrected defective column information; and a memory bank suitable for performing a column repair operation based on the error-corrected defective column information.

13 Claims, 4 Drawing Sheets

MEMORY DEVICE AND OPERATION METHOD OF THE SAME

CROSS-REFERENCE TO RELATED APPLICATIONS

The present application claims priority of Korean Patent Application No. 10-2017-0176875, filed on Dec. 21, 2017, which is incorporated herein by reference in its entirety.

BACKGROUND

1. Field

Exemplary embodiments of the present invention relate to a memory device, and more particularly, to a technology related to repair.

2. Description of the Related Art

In the early stage of a semiconductor memory device industry, there were many good dies on the wafers, which means that memory chips were produced with no defective memory cells through semiconductor fabrication processes. However, as the capacity of memory devices increases, it becomes difficult to fabricate a memory device that does not have any defective memory cells. Presently, there is substantially no chance that a memory device is fabricated without any defective memory cells. To address this problem, a repair method has been developed which includes redundancy memory cells in a memory device and replacing defective memory cells with the redundancy memory cells.

FIG. 1 is a block diagram illustrating a repair operation in a conventional memory device.

FIG. 1 shows a structure corresponding to one memory bank BKN, i.e., a memory bank N, where N is an arbitrary integer that is equal to or greater than '0'.

Referring to FIG. 1, the memory bank BKN may include a cell array 110, a row circuit 120, a column circuit 130 and a comparison circuit 140. The fuse circuit 150 may store a defective column address DEFECT_C_ADD for the repairing of the memory bank BKN.

The cell array 110 may include a plurality of memory cells for storing data. The cell array 110 may include a plurality of word lines that are arrayed in a row direction and a plurality of bit lines that are arrayed in a column direction, and the memory cells may be arrayed at the cross points between the word lines and the bit lines. The cell array 110 may include redundant bit lines for repairing bit lines other than general bit lines.

The row circuit 120 may activate a word line that is selected based on a row address R_ADD while a row active signal RACT_BKN is activated. The row active signal RACT_BKN may be activated when an active operation of the memory bank BKN is directed and be inactivated when a precharge operation of the memory bank is directed.

The column circuit 130 may access (read or write) a data of a bit line that is selected based on a column address C_ADD. A read signal IRD_BKN may be a signal that is activated when a read operation of the memory bank BKN is directed, and a write signal IWT_BKN is a signal that is activated when a write operation of the memory bank BKN is directed. When the read signal IRD_BKN is activated, a read operation may be performed, and when the write signal IWT_BKN is activated, a write operation may be performed.

The fuse circuit 150 may store the column address corresponding to a defective memory cell in the cell array 110 as a defective column address DEFECT_C_ADD. The comparison circuit 140 may compare the column address C_ADD inputted during the read or write operation with the defective column address DEFECT_C_ADD stored in the fuse circuit 150. The redundancy bit line may be accessed instead of the bit line designated by the column address C_ADD when the result of the comparison circuit 140 shows that the column address C_ADD and the defective column address DEFECT_C_ADD are the same. The bit line designated by the column address C_ADD may be accessed when the result of the comparison circuit 140 indicates that the column address C_ADD is different from the defective column address DEFECT_C_ADD.

The fuse circuit 150 may use laser fuses, which store data of a logic high or low level according to whether the laser fuse is programmed(cut) or not. The laser fuse may be programmed up to the stage of wafer, and may not be programmed after the wafer is mounted inside a package.

FIG. 2 is a block diagram illustrating a conventional non-volatile memory circuit for storing repair information in the memory device.

Referring to FIG. 2, the memory device may include a plurality of memory banks BK0 to BK3, defective latch circuits 210_BK0 to 210_BK3 that are respectively provided to the memory banks BK0 to BK3 to store defective column information, and a non-volatile memory circuit 201.

The non-volatile memory circuit 201 may substitute the fuse circuit 150. The non-volatile memory circuit 201 may store the defective column information DEFECT_C_BK0<0:63> to DEFECT_C_BK3<0:63> corresponding to all the memory banks BK0 to BK3. The non-volatile memory circuit 201 may be one among non-volatile memories, such as an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM) and a Phase Change Random Access Memory (PC RAM).

The defective latch circuits 210_BK0 to 210_BK3 respectively provided for the memory banks BK0 to BK3 may store the defective column information DEFECT_C_BK0<0:63> to DEFECT_C_BK3<0:63> of the corresponding memory banks BK0 to BK3. For example, the defective latch circuit 210_BK0 may store the defective column information DEFECT_C_BK0<0:63> of the memory bank BK0, and the defective latch circuit 210_BK2 may store column repair information DEFECT_C_BK2<0:63> of the memory bank BK2. The defective column information may include at least one set of defective column addresses. For example, the defective column information of one memory bank may include 8 sets of defective column addresses, and when one set of defective column addresses is 8 bits, the defective column information corresponding to one memory bank may be of 64 bits. Since the defective latch circuits 210_BK0 to 210_BK3 are capable of storing defective column information only while power is supplied, the defective latch circuits 210_BK0 to 210_BK3 may receive and store the defective column information from the non-volatile memory circuit 201 during a boot-up operation that is performed after the memory device is powered up.

The defective column information DEFECT_C_BK0<0:63> to DEFECT_C_BK3<0:63> stored in the non-volatile memory circuit 201 is not used directly for the repair operation but may be transferred to and stored in the defective latch circuits 210_BK0 to 210_BK3 for the following reasons. Since the non-volatile memory circuit 201 is formed in an array type, it takes a predetermined time to retrieve the information stored therein. As a result, it is impossible to perform a repair operation immediately by using the information stored in the non-volatile memory circuit 201. Therefore, the defective column information DEFECT_C_BK0<0:63> to DEFECT_C_BK3<0:63> stored in the non-volatile memory circuit 201 are transferred to and stored in the defective latch circuits 210_BK0 to 210_BK3 during the boot-up operation, and the repair operation may be performed using the information stored in the defective latch circuits 210_BK0 to 210_BK3 thereafter.

Since the non-volatile memory circuit 201 is programmable at any time, it may repair the defects that are additionally found even after the memory device is mounted inside the package, as well as after the manufacturing process is terminated.

As the capacity of the memory device increases, more memory cells have to be repaired, and this increases the capacity of the defective latch circuits 210_BK0 to 210_BK3 as well. As the capacity of the defective latch circuits 210_BK0 to 210_BK3 is increased, errors originating from diverse causes may occur in the information stored in the defective latch circuits 210_BK0 to 210_BK3 during or after the boot-up process.

SUMMARY

Embodiments of the present invention are directed to a technology for correcting errors that occur in a repair process of a memory device.

In accordance with an embodiment of the present invention, a memory device includes: a non-volatile memory circuit suitable for storing defective column information; a defective latch circuit suitable for receiving and storing the defective column information from the non-volatile memory circuit during a boot-up operation; an error correction code generation circuit suitable for generating an error correction code for correcting errors of the defective column information; an error correction code latch circuit suitable for storing the error correction code; an error correction circuit suitable for correcting errors of the defective column information transferred from the defective latch circuit based on the error correction code which is transferred from the error correction code latch circuit so as to produce an error-corrected defective column information; and a memory bank suitable for performing a column repair operation based on the error-corrected defective column information.

In accordance with another embodiment of the present invention, a memory device includes: a non-volatile memory circuit suitable for storing first defective column information and second defective column information; a first defective latch circuit suitable for receiving and storing the first defective column information from the non-volatile memory circuit during a boot-up operation; a first error correction code generation circuit suitable for generating a first error correction code for correcting errors of the first defective column information; a first error correction code latch circuit suitable for storing the first error correction code; a first error correction circuit suitable for correcting the errors of the first defective column information transferred from the first defective latch circuit based on the first error correction code which is transferred from the first error correction code latch circuit so as to produce an error-corrected first defective column information; a first memory bank suitable for performing a column repair operation based on the error-corrected first defective column information; a second defective latch circuit suitable for receiving and storing the second defective column information from the non-volatile memory circuit during the boot-up operation; a second error correction code generation circuit suitable for generating a second error correction code for correcting errors of the second defective column information; a second error correction code latch circuit suitable for storing the second error correction code; a second error correction circuit suitable for correcting the errors of the second defective column information transferred from the second defective latch circuit based on the second error correction code which is transferred from the second error correction code latch circuit so as to produce an error-corrected second defective column information; and a second memory bank suitable for performing a column repair operation based on the error-corrected second defective column information.

In accordance with yet another embodiment of the present invention, a method for operating a memory device includes: transferring defective column information from a non-volatile memory to a defective column latch circuit; generating an error correction code based on the defective column information; storing the error correction code in an error correction code latch circuit; applying an active command to the memory device; performing an active operation in response to the active command; correcting an error of the defective column information transferred from the defective column latch circuit based on the error correction code which is transferred from the error correction code latch circuit in response to the active command so as to produce an error-corrected defective column information; applying a column command and a column address to the memory device; deciding whether the column address is the same as a defective column address included in the error-corrected defective column information; accessing a column corresponding to the column address when the column address is not determined to be the same as the defective column address included in the error-corrected defective column information; and accessing a redundant column when the column address is determined to be the same as the defective column address included in the error-corrected defective column information.

DETAILED DESCRIPTION

Figure 1:
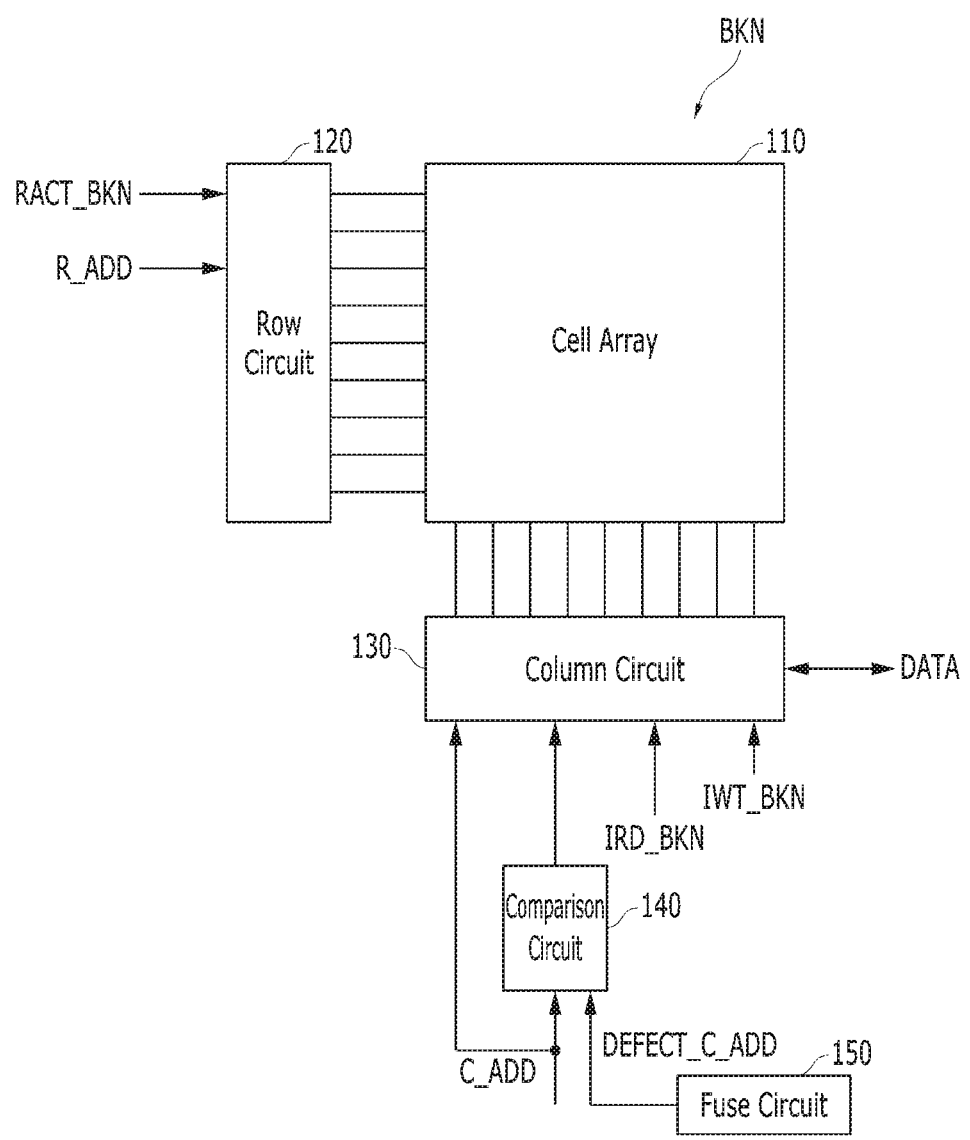
FIG. 1 is a block diagram illustrating a repair operation in a conventional memory device.
Figure 2:
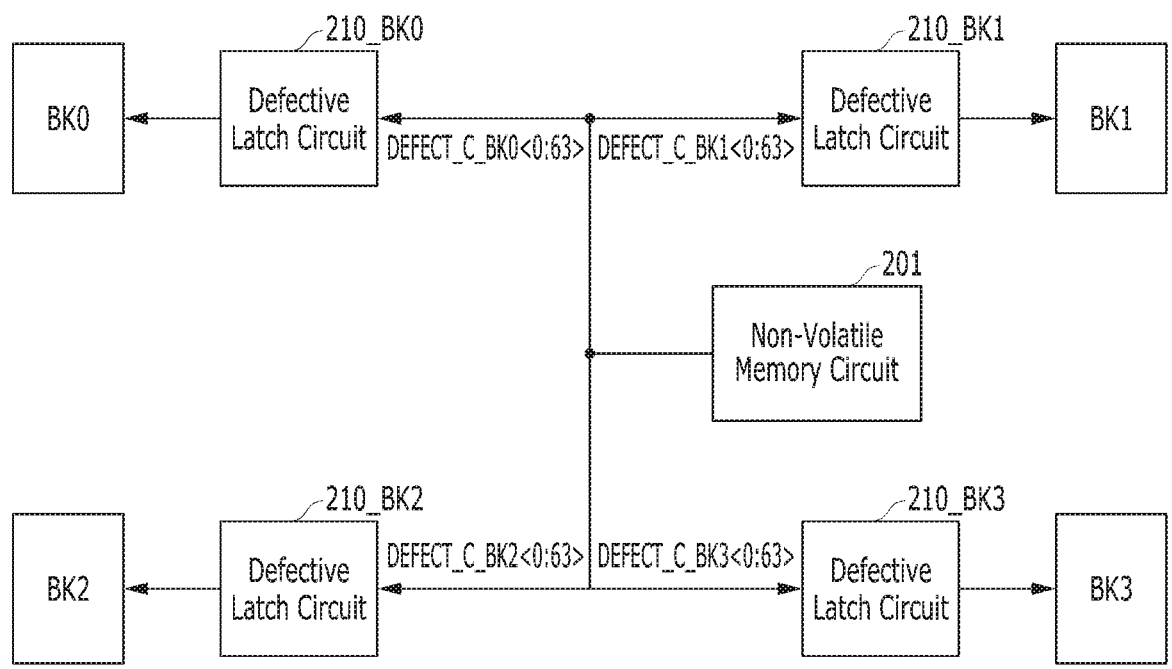
FIG. 2 is a block diagram illustrating a conventional non-volatile memory circuit for storing repair information in the memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art, and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 3:
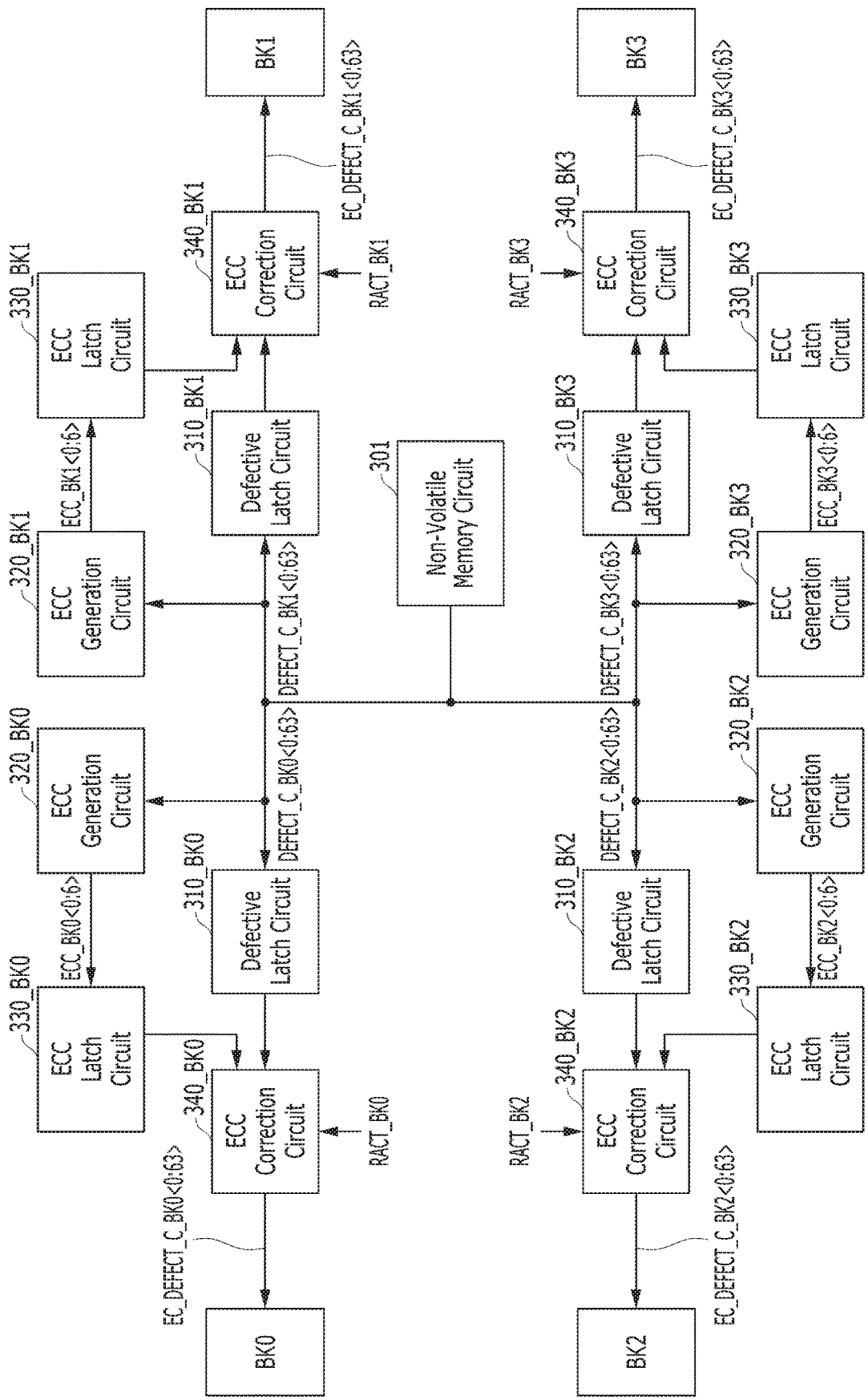
FIG. 3 is a block diagram illustrating a memory device in accordance with an embodiment of the present invention.

FIG. 3 is a block diagram illustrating a memory device in accordance with an embodiment of the present invention.

Referring to FIG. 3, the memory device may include a non-volatile memory circuit 301, a plurality of memory banks BK0 to BK3, defective latch circuits 310_BK0 to 310_BK3, error correction code generation circuits 320_BK0 to 320_BK3, error correction code latch circuits 330_BK0 to 330_BK3, and error correction circuits 340_BK0 to 340_BK3.

In the non-volatile memory circuit 301, defective column information DEFECT_C_BK0<0:63> to DEFECT_C_BK3<0:63> of the memory banks BK0 to BK3 may be stored. The non-volatile memory circuit 301 may be one among such non-volatile memories as an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), and a Phase Change Random Access Memory (PCRAM).

The defective latch circuits 310_BK0 to 310_BK3 may store the defective column information DEFECT_C_BK0<0:63> to DEFECT_C_BK3<0:63> of the memory banks corresponding thereto. For example, the defective latch circuit 310_BK0 may store the defective column information DEFECT_C_BK0<0:63> of the memory bank BK0, and the defective latch circuit 310_BK2 may store the defective column information DEFECT_C_BK2<0:63> of the memory bank BK2. The defective column information may include at least one set of defective column addresses. For example, the defective column information of one memory bank may include 8 sets of defective column address, and when one set of defective column address is 8 bits, the defective column information corresponding to one memory bank may be of 64 bits. Since the defective latch circuits 310_BK0 to 310_BK3 are capable of storing the defective column information DEFECT_C_BK0<0:63> to DEFECT_C_BK3<0:63> only while power is supplied, the defective column information DEFECT_C_BK0<0:63> to DEFECT_C_BK3<0:63> may be received from the non-volatile memory circuit 301 and stored during the boot-up operation which is performed after the memory device is powered up.

The error correction code generation circuits 320_BK0 to 320_BK3 may generate error correction codes ECC_BK0<0:6> to ECC_BK3<0:6> for correcting the errors of the defective column information DEFECT_C_BK0<0:63> to DEFECT_C_BK3<0:63> of the memory banks corresponding thereto. For example, the error correction code generation circuit 320_BK1 may generate the error correction code ECC_BK1<0:6> by using the defective column information DEFECT_C_BK1<0:63>, and the error correction code generation circuit 320_BK2 may generate the error correction code ECC_BK2<0:6> by using the defective column information DEFECT_C_BK2<0:63>. The error correction code generation circuits may generate the error correction codes ECC_BK0<0:6> to ECC_BK3<0:6> by using one among various error correction code (ECC) algorithms, such as Hamming, Bose-Chaudhuri-Hocquenghem (BCH) and Reed-Solomon (RS). It is illustrated herein that a 7-bit error correction code ECC_BK0<0:6> to ECC_BK3<0:6> is generated for each bank by using the defective column information DEFECT_C_BK0<0:63> to DEFECT_C_BK3<0:63> of 64 bits. When the error correction code is a Hamming code, an error of one bit occurring in the defective column information DEFECT_C_BK0<0:63> to DEFECT_C_BK3<0:63> of 64 bits may be corrected by using a 7-bit error correction code ECC_BK0<0:6> to ECC_BK3<0:6>.

The error correction code latch circuits 330_BK0 to 330_BK3 may store the error correction codes ECC_BK0<0:6> to ECC_BK3<0:6> generated in the error correction code generation circuits 320_BK0 to 320_BK3 of the memory bank corresponding thereto. For example, the error correction code latch circuit 330_BK3 may store the error correction code ECC_BK3<0:6> generated in the error correction code generation circuit 320_BK3. The error correction code latch circuits 330_BK0 to 330_BK3 may store the error correction codes ECC_BK0<0:6> to ECC_BK3<0:6> only while power is supplied. The generation of the error correction codes ECC_BK0<0:6> to ECC_BK3<0:6> of the error correction code generation circuits 320_BK0 to 320_BK3 and the storing of the error correction codes ECC_BK0<0:6> to ECC_BK3<0:6> of the error correction code latch circuits 330_BK0 to 330_BK3 may be performed during the boot-up operation.

The error correction circuits 340_BK0 to 340_BK3 may correct the error of the defective column information DEFECT_C_BK0<0:63> to DEFECT_C_BK3<0:63> stored in the defective latch circuits 310_BK0 to 310_BK3 of the memory banks corresponding thereto by using the error correction codes ECC_BK0<0:6> to ECC_BK3<0:6> stored in the error correction code latch circuits 330_BK0 to 330_BK3 of the memory banks corresponding thereto. For example, the error correction circuit 340_BK0 may correct the error of the defective column information DEFECT_C_BK0<0:63> stored in the defective latch circuit 310_BK0 by using the error correction code ECC_BK0<0:6> stored in the error correction code latch circuit 330_BK0. The error-corrected defective column information EC_DEFECT_C_BK0<0:63> to EC_DEFECT_C_BK3<0:63> in which errors are corrected by the error correction circuits 340_BK0 to 340_BK3 may be used for a repair operation of the memory banks BK0 to BK3. The error correction operations of the error correction circuits 340_BK0 to 340_BK3 may be performed at each active operation of the corresponding memory bank. For example, the error correction circuit 340_BK2 may perform an error correcting operation whenever the active operation of the memory bank BK2 is performed, that is, whenever a row active signal RACT_BK2 of the memory bank BK2 is activated. Also, the error correction circuit 340_BK3 may perform an error correction operation whenever the active operation of the memory bank BK3 is performed, that is, whenever the row active signal RACT3 of the memory bank BK3 is activated.

The column repair operation of the memory banks BK0 to BK3 may have to be performed before the read or write operation of the memory banks BK0 to BK3 are performed. The read or write operation of the memory banks BK0 to BK3 may be performed only after the active operation. Therefore, when the error correction circuits 340_BK0 to 340_BK3 correct the errors of the defective column information DEFECT_C_BK0<0:63> to DEFECT_C_BK3<0:63> at each active operation, the memory banks BK0 to BK3 may perform a column repair operation by using the error-corrected defective column information EC_DEFECT_C_BK0<0:63> to EC_DEFECT_C_BK3<0:63> during the read or write operation. A predetermined time interval tRCD, which represents RAS to CAS Delay, is guaranteed from the active operation of the memory banks BK0 to BK3 to the read or write operation. During the predetermined time interval, the error correction circuits 340_BK0 to 340_BK3 may be secured with a sufficient time for performing an error correction operation. Since the error correction circuits 340_BK0 to 340_BK3 perform the error correction operations for each active operation of the corresponding memory banks BK0 to BK3, the errors of the defective column information DEFECT_C_BK0<0:63> to DEFECT_C_BK3<0:63> may be corrected between an active operation and a following active operation.

The memory banks BK0 to BK3 may perform a column repair operation by using the error-corrected defective column information EC_DEFECT_C_BK0<0:63> to EC_DEFECT_C_BK3<0:63> provided from the error correction circuits 340_BK0 to 340_BK3. The memory banks BK0 to BK3 may include a cell array 110, a row circuit 120, a column circuit 130, and a comparison circuit 140 just as the memory bank BKN of FIG. 1.

Although FIG. 3 exemplarily illustrates that the memory device includes four memory banks BK0 to BK3, it is obvious to those skilled in the art that the number of the memory banks included in the memory device may be different.

Figure 4:
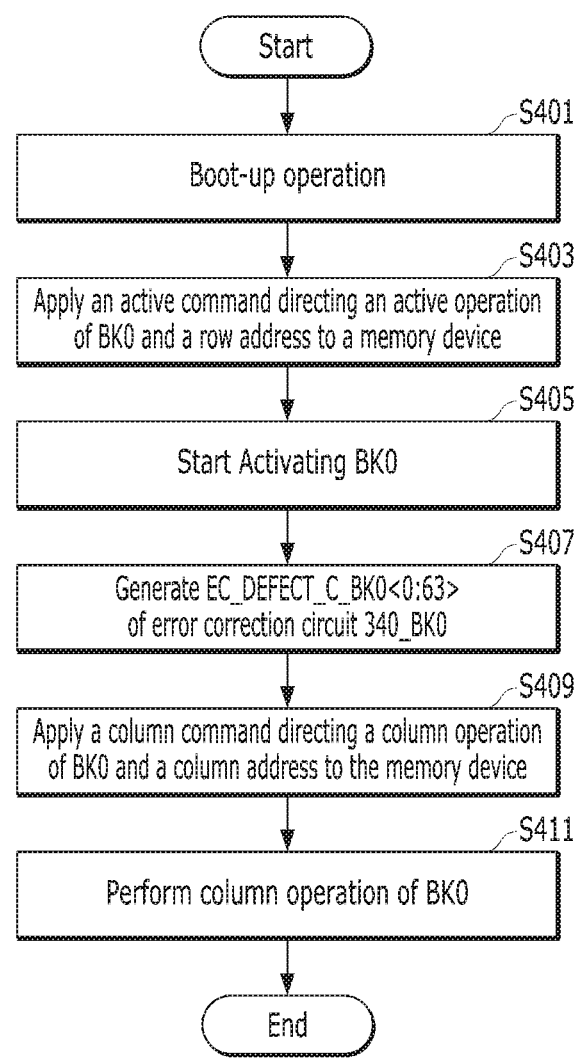
FIG. 4 is a flowchart describing an operation of the memory device shown in FIG. 3.

FIG. 4 is a flowchart describing an operation of the memory device shown in FIG. 3.

Referring to FIG. 4, the memory device may be powered up first and then a boot-up operation may be performed in step S401. The defective column information DEFECT_C_BK0<0:63> to DEFECT_C_BK3<0:63> may be transferred from the non-volatile memory circuit 301 to the defective latch circuits 310_BK0 to 310_BK3 through the boot-up operation and stored therein, and the error correction codes ECC_BK0 to ECC_BK3 may be generated by the error correction code generation circuits 320_BK0 to 320_BK3 and stored in the error correction code latch circuits 330_BK0 to 330_BK3.

An active command directing an active operation of the memory bank BK0 and a row address may be applied to the memory device in step S403. In this way, a row active signal RACT0 of the memory bank BK0 may be activated and the memory bank BK0 may start to be activated in step S405. In other words, a word line corresponding to the row address applied together with the active command in the memory bank BK0 may start to be activated.

In response to the activation of the low active signal RACT0 of the memory bank BK0, the error correction circuit 340_BK0 may correct the error of the defective column information DEFECT_C_BK0<0:63> and generate the error-corrected defective column information EC_DEFECT_C_BK0<0:63> in step S407.

Subsequently, a column command (read or write command) for directing a column operation (read or write operation) of the memory bank BK0 and a column address may be applied to the memory device in step S409.

In the memory bank BK0, a column operation may be performed in step S411. The column operation of the memory bank BK0 may be performed with the column being repaired by the error-corrected defective column information EC_DEFECT_C_BK0<0:63>. In other words, when the column address applied in the step S409 is the same as the column address included in the error-corrected defective column information EC_DEFECT_C_BK0<0:63>, a redundant column may be accessed in the memory bank BK0. Otherwise, a column corresponding to the column address applied in the step S409 in the memory bank BK0 may be accessed.

According to the embodiments of the present invention, an error occurring in a repair process of a memory device may be corrected.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a non-volatile memory circuit suitable for storing defective column information;
   a defective latch circuit suitable for receiving and storing the defective column information from the non-volatile memory circuit during a boot-up operation;
   an error correction code generation circuit suitable for generating an error correction code for correcting an error of the defective column information based on the defective column information;
   an error correction code latch circuit suitable for storing the error correction code;
   an error correction circuit suitable for correcting the error of the defective column information transferred from the defective latch circuit based on the error correction code which is transferred from the error correction code latch circuit so as to produce error-corrected defective column information; and
   a memory bank suitable for performing a column repair operation based on the error-corrected defective column information.

2. The memory device of claim 1, wherein the error correction circuit performs an error correction operation during an active operation of the memory bank.

3. The memory device of claim 1, wherein the defective column information includes at least one set of defective column addresses.

4. The memory device of claim 3, wherein the memory bank includes:
- a cell array;
- a comparison circuit suitable for comparing the defective column addresses with an external column address so as to produce a comparison result; and
- a column circuit suitable for when the comparison result of the comparison circuit determines that the external column address is the same as the one set of the defective column addresses, accessing a redundant column of the cell array, while accessing a column corresponding to the external column address in the cell array.

5. The memory device of claim 1, wherein the generation of the error correction code of the error correction code generation circuit is performed during the boot-up operation.

6. A memory device, comprising:
- a non-volatile memory circuit suitable for storing first defective column information and second defective column information;
- a first defective latch circuit suitable for receiving and storing the first defective column information from the non-volatile memory circuit during a boot-up operation;
- a first error correction code generation circuit suitable for generating a first error correction code for correcting an error of the first defective column information based on the first defective column information;
- a first error correction code latch circuit suitable for storing the first error correction code;
- a first error correction circuit suitable for correcting the error of the first defective column information transferred from the first defective latch circuit based on the first error correction code which is transferred from the first error correction code latch circuit so as to produce an error-corrected first defective column information;
- a first memory bank suitable for performing a column repair operation based on the error-corrected first defective column information;
- a second defective latch circuit suitable for receiving and storing the second defective column information from the non-volatile memory circuit during the boot-up operation;
- a second error correction code generation circuit suitable for generating a second error correction code for correcting an error of the second defective column information based on the second defective column information;
- a second error correction code latch circuit suitable for storing the second error correction code;
- a second error correction circuit suitable for correcting the error of the second defective column information transferred from the second defective latch circuit based on the second error correction code which is transferred from the second error correction code latch circuit so as to produce error-corrected second defective column information; and
- a second memory bank suitable for performing a column repair operation based on the error-corrected second defective column information.

7. The memory device of claim 6, wherein the first error correction circuit performs an error correction operation during an active operation of the first memory bank, and
the second error correction circuit performs an error correction operation during an active operation of the second memory bank.

8. The memory device of claim 6, wherein each of the first defective column information and the second defective column information includes at least one set of defective column addresses.

9. The memory device of claim 8, wherein each of the first memory bank and the second memory bank includes:
- a cell array;
- a comparison circuit suitable for comparing the defective column addresses with an external column address so as to produce a comparison result; and
- a column circuit suitable for when the comparison result of the comparison circuit determines that the external column address is the same as the one set of the defective column addresses, accessing a redundant column of the cell array, while accessing a column corresponding to the external column address in the cell array.

10. The memory device of claim 6, wherein the generation of the first error correction code of the first error correction code generation circuit and the generation of the second error correction code of the second error correction code generation circuit are performed during the boot-up operation.

11. A method for operating a memory device, comprising:
- transferring defective column information from a non-volatile memory to a defective column latch circuit;
- generating an error correction code based on the defective column information;
- storing the error correction code in an error correction code latch circuit;
- applying an active command to the memory device;
- performing an active operation in response to the active command;
- correcting an error of the defective column information transferred from the defective column latch circuit based on the error correction code which is transferred from the error correction code latch circuit in response to the active command so as to produce error-corrected defective column information;
- applying a column command and a column address to the memory device;
- determining whether the column address is the same as a defective column address included in the error-corrected defective column information;
- accessing a column corresponding to the column address when the column address is not determined to be the same as the defective column address included in the error-corrected defective column information; and
- accessing a redundant column when the column address is determined to be the same as the defective column address included in the error-corrected defective column information.

12. The method of claim 11, wherein the column command is one of a read command and a write command.

13. The method of claim 11, wherein the defective column information includes at least one set of defective column addresses.

* * * * *